United States Patent
Gospe

(10) Patent No.: US 6,335,627 B1
(45) Date of Patent: Jan. 1, 2002

(54) APPARATUS AND METHOD FOR TESTING AN ELECTRONICS PACKAGE SUBSTRATE

(75) Inventor: Stephen Bradford Gospe, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/059,619

(22) Filed: Apr. 13, 1998

(51) Int. Cl.[7] .................. G01R 31/02; G01R 31/08; G01R 31/00
(52) U.S. Cl. .................. 324/754; 324/531; 324/500
(58) Field of Search .................. 324/755, 754, 324/761, 500, 537, 531

(56) References Cited

U.S. PATENT DOCUMENTS

| | | | | |
|---|---|---|---|---|
| 4,056,773 A | * | 11/1977 | Sullivan | 324/500 |
| 4,686,465 A | * | 8/1987 | Kruger | 324/754 |
| 4,868,493 A | * | 9/1989 | Becker | 324/537 |
| 4,912,403 A | * | 3/1990 | Siefers | 324/537 |
| 5,166,601 A | * | 11/1992 | Van Klooser | 324/537 |
| 5,389,885 A | * | 2/1995 | Swart | 324/754 |
| 5,835,997 A | * | 11/1998 | Yassine | 324/754 |
| 5,955,888 A | * | 9/1999 | Frederickson et al. | 324/754 |

* cited by examiner

*Primary Examiner*—Safet Metjahic
*Assistant Examiner*—Jermele M. Hollington
(74) *Attorney, Agent, or Firm*—Blakely, Sokoloff, Taylor & Zafman LLP

(57) ABSTRACT

An apparatus for testing an electrical connection between a first electrical contact on a first side of an electronics package substrate and a first electrical terminal on a second, opposing side of the substrate. A holder is provided which is capable of releasably receiving and holding a substrate. At least a first electrical pin is located on the holder. The first electrical pin is positioned to contact the first electrical contact on the first side of the substrate. A support structure is mounted to the holder. An electrical probe is mounted to the support structure. The electrical probe is movable relatively to the support structure between a first position and a second position. In the first position the electrical probe is distant from the first electrical terminal on the second side of the substrate. In the second position the electrical probe is in contact with the first electrical terminal.

23 Claims, 1 Drawing Sheet

US 6,335,627 B1

APPARATUS AND METHOD FOR TESTING AN ELECTRONICS PACKAGE SUBSTRATE

BACKGROUND OF THE INVENTION

1). Field of the Invention

This invention relates to an apparatus and a method for testing an electrical connection between a electrical contacts on a first side of an electronics package substrate and electrical terminals on a second, opposing side of the substrate.

2). Discussion of Related Art

Integrated circuits are usually manufactured within semiconductor chips. These semiconductor chips are then located on substrates and electrical connection is made between the integrated circuit and the substrate by way of C4 (controlled collapse chip connect), TAB (type automated bonding) tape, wire bonding or other techniques which are known in the art.

These substrates usually have first and second opposed surfaces with electrical contacts on the first surface and electrical terminals on the second surface. Various electrical connections extend between the electrical contacts and the electrical terminals.

The semiconductor chips, the substrates and the structures interconnecting the substrates with the integrated circuit are usually tested before being sold. In certain instances it may be required to test and isolate the electrical connections within the substrate.

FIG. 1 is an example of a substrate 10 of the above kind. First and second electrical contacts, 12A and 12B respectively, are located on a first surface 14 of the substrate 10. First, second and third electrical terminals 16A, 16B and 16C are located on a second, opposing surface 18 of the substrate 10. The first electrical contact 12A is electrically connected to the first electrical terminal 16A. The second electrical contact is electrically connected to the second electrical terminal 16B and to the third electrical terminal 16C. For purposes of discussion, an electrical disconnection exists between the second electrical contact 12B and the second electrical terminal 16B. The electrical disconnection may be required to be detected for further analysis.

One conventional method of testing for electrical disconnections is by applying an electrical current over the first and second electrical contacts 12A and 12B, and shorting off the electrical terminals 16A, 16B and 16C by means of a piece of foil. Such a technique would still allow current from the first electrical contact 12A to the first electrical terminal 16A, through the foil from the first electrical terminal 16A to the third electrical terminal 16C, and from the third electrical terminal 16C to the second electrical contact 12B. The electrical disconnection would therefore not be detected. What is required therefore is an apparatus and a method wherein individual contact can be made to the electrical contacts 12A and 12B and the electrical terminals 16A, 16B and 16C.

SUMMARY OF THE INVENTION

An apparatus for testing an electrical connection between a first electrical contact on a first side of an electronics package substrate and a first electrical terminal on a second, opposing side of the substrate. A holder is provided which is capable of releasably receiving and holding a substrate. At least a first electrical pin is located on the holder. The first electrical pin is positioned to contact the first electrical contact on the first side of the substrate. A support structure is mounted to the holder. An electrical probe is mounted to the support structure. The electrical probe is movable relatively to the support structure between a first position and a second position. In the first position the electrical probe is distant from the first electrical terminal on the second side of the substrate. In the second position the electrical probe is in contact with the first electrical terminal.

BRIEF DESCRIPTION OF THE DRAWINGS

The invention is further described by way of example with reference to the accompanying drawings wherein.

DESCRIPTION OF PREFERRED EMBODIMENT

Figure 2:
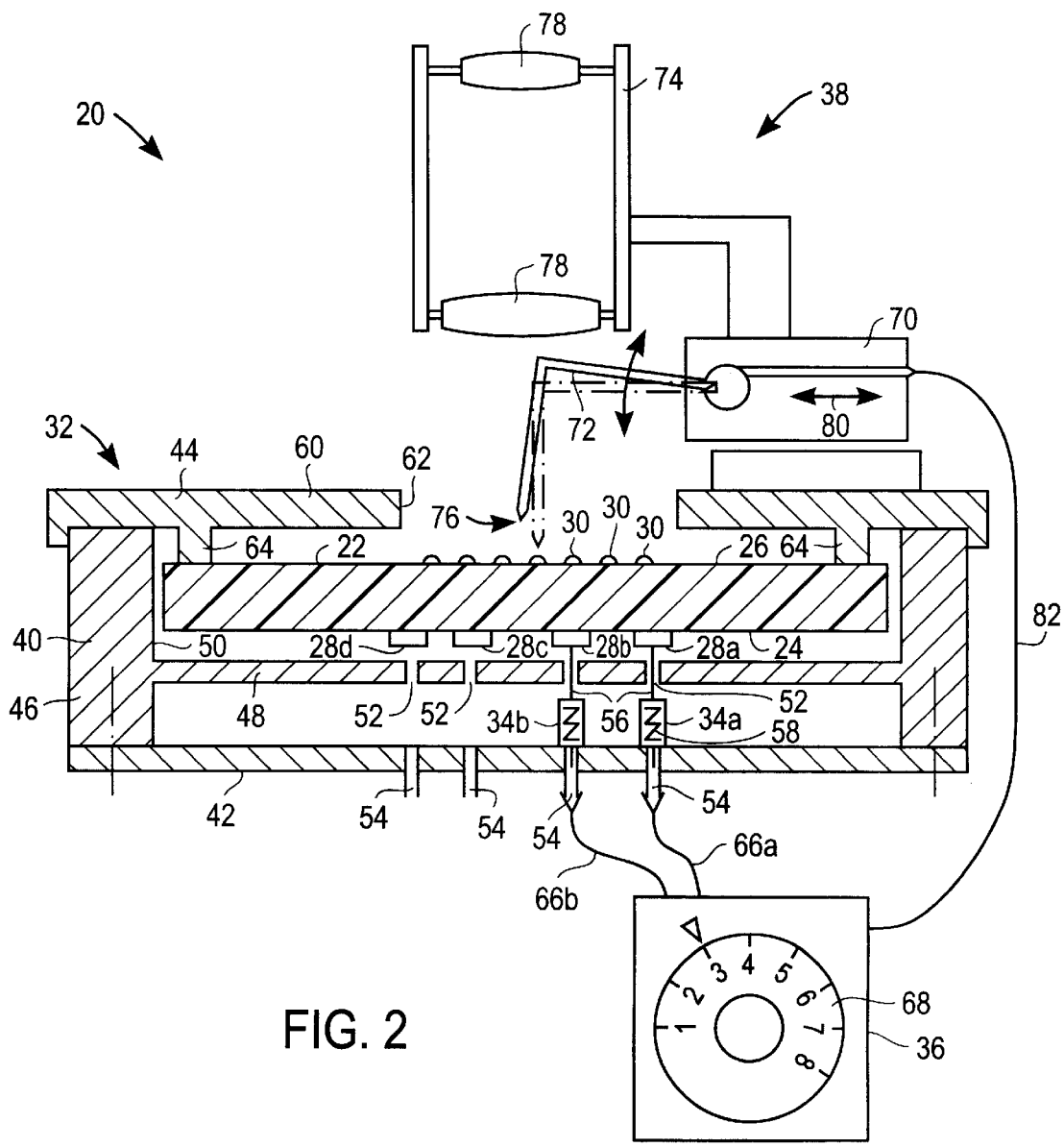
FIG. 2 is a sectioned side view illustrating apparatus for testing electrical connections between electrical contacts on a first side of an electronics package substrate and electrical terminals on a second, opposing side of the substrate.

FIG. 2 of the accompanying drawings illustrates an apparatus 20 which is used for testing electrical connections in an electronics package substrate 22.

The electronics package substrate 22 includes a first side 24 and a second, opposing side 26. Electrical contacts 28A, 28B, 28C, 28D are located on the first side 24 of the substrate 22. Electrical terminals 30 are located on the second side of the substrate 22. About 576 electric terminals 30 are located in an area of about one centimeter square.

The apparatus 20 includes a holder 32, a number of electrical pogo pins 34A, 34B, an electrical tester 36, and a probe station 38.

The holder 32 includes a main body 40, a cover 42 which is mounted to the body, and a cap 44 which is secured to the main body 40.

The main body 40 has an outer portion 46 and a flange 48 located within the outer portion 46. The outer portion 46 and the flange 48 jointly define a recess 50 for locating the substrate 22 with the electrical contacts 28A–D facing towards the flange 48.

Holes 52 are formed through the flange 48.

Tubes 54 extend through the cover 42.

The electrical pins 34A and 34B are located between the flange 48 and the cover 42. An end 56 of each electrical pin extends through a hole 52 in the flange 48. A spring 58 is located within each electrical pin 34A or 34B. The spring biases the end 56 into contact with a respective electrical contact 28A or 28B.

The cover 42 is removable from the main body 40 to allow for removal of the electrical pins 34A or 34B. The electrical pins 34A or 34B may then be located so as to make contact with a required electrical contact 28A–D or any combination of the electrical contacts 28A–D.

The cap 44 has a main portion 60 through which an opening 62 is formed, and a neck 64. The cap 60 is securable in position on the main body 40 so that the cap 60 retains the substrate 22 within the recess 50. The neck 64 biases the substrate 22 against the electrical pins 34A and 34B. A first electrical lead 66A is connected to the tube 54 at the first electrical pin 34A. A second electrical lead 66B is connected to the tube 54 at the second electrical pin 34B. Both electrical leads 66A and 66B are connected to the electrical tester 36.

The electrical tester 36 includes a dial selector 68 to select an input from either the first electrical lead 66A or the second electrical lead 66B. Although only two electrical leads 66A and 66B are shown, it should be understood that this is done merely for illustration purposes. More electrical pins may therefore be located between the flange 48 and the cover 42 and be connected to the electrical tester 36. The dial selector 68 on the electrical tester 36 may then be adjusted to select an input. The electrical tester typically has about eight available inputs.

The probe station 34 includes a support structure 70 which is mounted to the cap 44 of the holder 32, an electrical probe 72, and an optical device 74 mounted to the support structure 70.

The electrical probe 72 has a sharp point 76 and is pivotably mounted to the support structure 70. Pivoting of the electrical probe 72 allows for movement of the electrical probe between a first position wherein the electrical probe is distant from the electrical terminals 30, and a second position wherein the electrical probe extends through the opening 62 and is in contact with a selected one of the electrical terminals 30. The sharp point 76 of the electrical probe 72 makes point contact with the selected electrical terminal 30.

The optical device 72 includes a system of magnifying lenses 78 which allows for viewing of the electrical probe 72 when contacting the selected electrical terminal 30.

The support structure 70 is movable, as indicated by the arrow 80, relatively to the holder 32.

An electrical extension 82 connects the electrical probe 72 with the electrical tester 36.

In use an operator may want to test an electrical connection between only one of the electrical contacts 28A and only one of the electrical terminals 30. In addition, the operator may also want to test an electrical connection between another one of the electrical contacts 28B with one of the electrical terminals 30. The operator would then locate a respective electrical pin 34A or 34B in position to contact the required electrical contacts 28A or 28B. The substrate 22 is then located in position within the recess 50. The cap 44 is then located in position on the main body 40 so that the substrate 22 is biased against the ends 56 of the electrical pins 34A or 34B. Electrical connection is then made to the electrical tester 36 by means of the electrical leads 66A or 66B.

While viewing the electrical probe 72 and the electrical terminals 30 through the system of magnifying lenses 78, the operator then moves the support structure 70 so that the sharp point 76 will make contact with a selected electrical terminal 30. The electrical probe 72 is then pivoted so that the sharp point 76 makes contact with the selected electrical terminal 30.

The electrical tester 36 is now connected to the electrical contacts 28A and 28B, and with the electrical selected terminal 30. An operator then selects an input, by means of the dial selector 68, from one of the electrical contacts 28A or 28B. Utilizing the electrical tester 36, an electrical connection can so be tested between the selected electrical terminal 28A or 28B and the selected electrical terminal 30 with which the electrical probe 72 makes contact.

Figure 1:
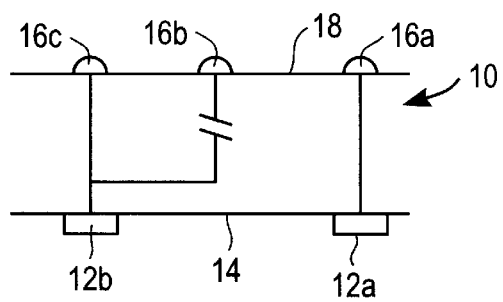
FIG. 1 is a cross-sectional view of an electronics package substrate illustrating potential electrical connections and a disconnection between electrical contacts on a first side of the substrate and electrical terminals on a second, opposing side of the substrate.

As seen from the foregoing description and discussion, an electrical connection between a single electrical contact 28A or 28B and a single electrical terminal 30 can be tested. A single electrical disconnection such as shown in FIG. 1 can so be established for further analysis. An operator may also select an input, as required, from one of the electrical contacts 28A or 28B. The operator may further, as required, select an input from a required electrical terminal 30. Furthermore, an operator may remove the cover 42 and move the electrical pins 34A and 34B around for purposes of testing other electrical contacts 28A, 28B, 28C or 28D. The operator may also move the support structure 70 so that the electrical probe 72 makes contact with another one of the electrical terminals 30.

While certain exemplary embodiments have been described and shown in the accompanying drawings, it is to be understood that such embodiments are merely illustrative and not restrictive of the current invention, and that this invention is not restricted to the specific constructions and arrangements shown and described, since modifications may occur to those ordinarily skilled in the art.

In particular, although only one electrical probe 72 is shown in FIG. 1, it should be understood that more than one electrical probe may be provided. The respective electrical probes may then each make contact with a different terminal 30 at the same time.

What is claimed:

1. An apparatus for testing an electrical connection between a first electrical contact on a first side of an electronics package substrate and a first electrical terminal on a second opposing side of the substrate, the apparatus including:

a holder which is capable of releasable receiving and holding the substrate;

at least a first electrical pin on the holder, the first electrical pin being positioned to contact the first electrical contact on the first side of the substrate;

a support structure which is mounted to the holder for movement in a first direction relative to the holder; and an electrical probe which is mounted to the support structure, the electrical probe being movable relatively to the support structure in a second direction which is transverse to the first direction between a first position wherein the electrical probe is distant from the first electrical terminal on the second side of the substrate, and a second position wherein the electrical probe is in contact with the first electrical terminal.

2. The apparatus of claim 1 wherein the electrical probe makes point contact with the first electrical terminal.

3. The apparatus of claim 1 wherein the electrical pin is a pogo pin.

4. The apparatus of claim 1 which includes:

an electrical tester a first electrical lead connecting the first electrical pin with the electrical tester; and a first electrical extension connecting the electrical probe with the electrical tester.

5. The apparatus of claim 1 which includes a second electrical pin on the holder, the second electrical pin being positioned to contact a second electrical contact on the first side of the substrate, the first and second electrical contacts being spaced from one another.

6. The apparatus of claim 5 which includes:

an electrical tester;

a first electrical lead connecting the first electrical pin with the electrical tester;

a second electrical lead connecting the second electrical pin with the electrical tester, the electrical tester having a selector to select an input from either the first or the second electrical lead; and an electrical extension connecting the electrical probe with the electrical tester.

7. The apparatus of claim 1 wherein the first electrical pin is releasable located on the holder.

8. The apparatus of claim 1 which includes a biasing device which biases the electrical pin into contact with the first electrical contact.

9. The apparatus of claim 1 wherein the holder includes:
a main body with a flange having at least one hole formed therethrough; and
a cover mounted to the body, wherein the electrical pin is located between the flange and the cover with an end of the electrical pin extending through the hole and making contact with the first electrical contact.

10. The apparatus of claim 9 which includes a biasing device located between the flange and the cover, the biasing device biasing the end of the electrical pin into contact with the first electrical contact.

11. The apparatus of claim 9 wherein the cover is removable from the main body to allow for removal of the electrical pin.

12. The apparatus of claim 1 wherein the holder includes:
a main body defining a recess for locating the substrate; and
a cap which, when secured to the main body, retains the substrate within the recess.

13. The apparatus of claim 12 wherein the cap biases the substrate against the electrical pin.

14. The apparatus of claim 12 wherein the cap defines an opening and the electrical probe, when contacting the first electrical terminal, extends through the opening.

15. The apparatus of claim 1 which includes a magnifying lens located in position to view the electrical terminal.

16. An apparatus for testing electrical connections between respective electrical contacts on a first side of an electronics package substrate and respective electrical terminals on a second opposing side of the substrate, the apparatus including:
a holder which is capable of releasably receiving and holding the substrate;
a first electrical pin on the holder, the first electrical pin being positioned to contact a first of the electrical contacts on the first side of the substrate;
a second electrical pin on the holder, the second electrical pin being positioned to contact a second of the electrical contacts, which is spaced from the first electrical contact, on the first side of the substrate;
a support structure which is mounted to the holder for movement in a first direction relative to the holder; and
an electrical probe which is mounted to the support structure, the electrical probe being movable relatively to the support structure in a second direction which is transverse to the first direction between a first position wherein the electrical probe is distant from the electrical terminals on the second side of the substrate, and a second position wherein the electrical probe is in contact with one of the electrical terminals.

17. The apparatus of claim 16 which includes:
an electrical tester;
a first electrical lead connecting the first electrical pin with the electrical tester;
a second electrical lead connecting the second electrical pin with the electrical tester, the electrical tester having a selector to select an input from either the first or the second electrical lead; and
an electrical extension connecting the electrical probe with the electrical tester.

18. The apparatus of claim 16 which includes a magnifying lens located in position to view the electrical terminal.

19. A method of testing an electrical connection between an electrical contact on a first side of an electronic package substrate and an electrical terminal on a second opposing side of the substrate, comprising:
holding the substrate in a holder;
contacting an electrical pin with the electrical contact on the first side of the electronics package;
moving a support structure which is secured to the holder in a first direction relative to the holder;
moving an electrical probe which is secured to the support structure relative to the support structure in a second direction which is transverse to the first direction so that the electrical probe contacts the electrical terminal on the second side of the substrate; and
utilizing an electrical tester, connected to the electrical pin and the electrical probe, to test a characteristic over the electrical contact and the electrical terminal.

20. The method of claim 19 wherein the electrical probe makes point contact with the electrical terminal.

21. A method of testing electrical connections between respective electrical contacts on a first side of an electronics package substrate and respective electrical terminals on a second opposing side of the substrate, comprising:
holding a substrate in a holder;
contacting a first electrical pin with a first of the electrical contacts on the first side of the substrate;
contacting a second electrical pin with a second of the electrical contacts on the first side of the substrate;
adjusting a selector on an electrical tester to select an input from either the first or the second electrical pin;
moving a support structure which is secured to the holder in a first direction relative to the holder;
moving an electrical probe in a second direction which is transverse to the first direction relative to the support structure between a first position wherein the electrical probe is distant from the electrical terminals, and a second position wherein the electrical probe is in contact with one of the electrical terminals; and
utilizing the electrical tester to test a characteristic over the electrical contact and the electrical terminal.

22. The method of claim 21 wherein the electrical probe makes point contact with the electrical terminal.

23. The method of claim 21 comprising viewing the electrical terminal and the electrical probe through a magnifying lens while moving the support structure.

* * * * *